(12) United States Patent
Kang

(10) Patent No.: US 7,746,719 B2
(45) Date of Patent: Jun. 29, 2010

(54) MULTI-CHIP PACKAGE REDUCING POWER-UP PEAK CURRENT

(75) Inventor: Sang-Gu Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 168 days.

(21) Appl. No.: 12/177,323

(22) Filed: Jul. 22, 2008

(65) Prior Publication Data
US 2009/0027939 A1    Jan. 29, 2009

(30) Foreign Application Priority Data
Jul. 23, 2007    (KR)    ...................... 10-2007-0073591

(51) Int. Cl.
*G11C 17/18*    (2006.01)
(52) U.S. Cl. ..................... 365/225.7; 365/52
(58) Field of Classification Search .............. 365/225.7, 365/52, 189.04, 189.08
See application file for complete search history.

(56) References Cited

U.S. PATENT DOCUMENTS

| | | | | |
|---|---|---|---|---|
| 6,529,407 B2 * | 3/2003 | Shukuri | ................. | 365/185.07 |
| 6,870,786 B2 * | 3/2005 | Kanda et al. | ............. | 365/225.7 |
| 7,035,158 B2 * | 4/2006 | Kozuka | ................... | 365/225.7 |
| 7,085,181 B2 * | 8/2006 | Otsuka | ....................... | 365/200 |

FOREIGN PATENT DOCUMENTS

| | | | |
|---|---|---|---|
| JP | 2002157894 A | | 5/2002 |
| KR | 1019980055748 A | | 9/1998 |
| KR | 1019990053150 A | | 7/1999 |

* cited by examiner

*Primary Examiner*—Anh Phung
(74) *Attorney, Agent, or Firm*—Volentine & Whitt, PLLC

(57) ABSTRACT

Disclosed is a multi-chip package having a plurality of memory chips. Each memory chip includes a memory cell array storing e-fuse data, a read-out control circuit reading e-fuse data in response to a read signal, a first internal pad receiving a first control signal, a read-out controller generating the read signal to define a read period, and to generate a second control signal following the read period, and a second internal pad receiving the second control signal, wherein the plurality of memory chips is connected series and each respective read-out control circuit and read-out controller in each one of the plurality of memory chips cooperate to implement a sequential read of e-fuse data across the plurality of memory chips.

19 Claims, 14 Drawing Sheets

US 7,746,719 B2

MULTI-CHIP PACKAGE REDUCING POWER-UP PEAK CURRENT

CROSS-REFERENCE TO RELATED APPLICATIONS

This U.S. non-provisional patent application claims priority under 35 U.S.C. §119 of Korean Patent Application No. 10-2007-73591 filed on Jul. 23, 2007, the entire contents of which are incorporated herein by reference.

SUMMARY OF THE INVENTION

Embodiments of the invention are related to multi-chip packages operating with improved stability. Embodiments of the invention are related to multi-chip packages capable of reducing excessive peak currents.

In one embodiment, the invention provides a multi-chip package, comprising; a plurality of memory chips, each comprising, a memory cell array storing e-fuse data, a read-out control circuit performing a read operation directed to the e-fuse data in response to a read signal, a first internal pad receiving a first control signal, a read-out controller responsive to the first control signal to generate the read signal defining a read period for the read operation, and to generate a second control signal following the read period, and a second internal pad receiving the second control signal from the read-out controller. The plurality of memory chips is connected series and each respective read-out control circuit and read-out controller in each one of the plurality of memory chips cooperate to implement a sequential read of e-fuse data across the plurality of memory chips.

In another embodiment, the invention provides a multi-chip package, comprising; a plurality of memory chips, each comprising; a memory cell array storing e-fuse data, a read-out control circuit performing a read operation directed to the e-fuse data in response to a read signal, a first internal pad connected to a common control signal, a read-out controller responsive to the first control signal to generate the read signal defining a read period for the read operation, and to generate a second control signal following the read period, and second and third internal pads respectively connected to either ground or a power voltage to differentiate each memory chip in the plurality of memory chips. The plurality of memory chips is connected series and each respective read-out control circuit and read-out controller in each one of the plurality of memory chips cooperate to implement a sequential read of e-fuse data across the plurality of memory chips.

In another embodiment, the invention provides a computational logic system, comprising; a microprocessor and a memory controller connected via a bus and cooperating to store data in a memory device implemented in a multi-chip package, wherein the package comprises; a plurality of memory chips, each comprising; a memory cell array storing e-fuse data, a read-out control circuit performing a read operation directed to the e-fuse data in response to a read signal, a first internal pad receiving a first control signal, a read-out controller responsive to the first control signal to generate the read signal defining a read period for the read operation, and to generate a second control signal following the read period, and a second internal pad receiving the second control signal from the read-out controller. The plurality of memory chips is connected series and each respective read-out control circuit and read-out controller in each one of the plurality of memory chips cooperate to implement a sequential read of e-fuse data across the plurality of memory chips.

DESCRIPTION OF EMBODIMENTS

Multi-chip packages are a well known class of semiconductor memory devices that accommodate a plurality of memory chips within a single package board. High-performance, heavy-density, cost-consciousness, and miniaturation of components and elemental devices are well recognized drivers in the design and manufacturing of semiconductor memory devices. Indeed, in recent years, most semiconductor memory devices have been fabricated using a design rule of 0.18 μm or less.

Despite past efforts, semiconductor memory designers continue to seek semiconductor memory devices having greater integration density and smaller component size at lower costs. For the purpose of reducing overall size and product cost, certain manufacturing techniques have been used to mount two or more unit semiconductor "chips" on a single package board. Such packaging techniques are be highly effective in reducing the overall footprint of semiconductor devices within a host system. Such multi-chip packaging technology may be used to mount processors/controllers with multiple memory chips and/or related logic chips on a single package board.

Similar memory chips (whether implemented as naked dies or packaged (partially or completely) devices) functionally mounted on a single package board results in increased memory capacity. The use of conventional multi-chip packaging technology often requires the use of memory chips within a single package that are configured to share external pins (e.g., power, address, control, and data pins). For that reason, the memory chips within a single package are differentiated from each other by option pads.

Figure 1:
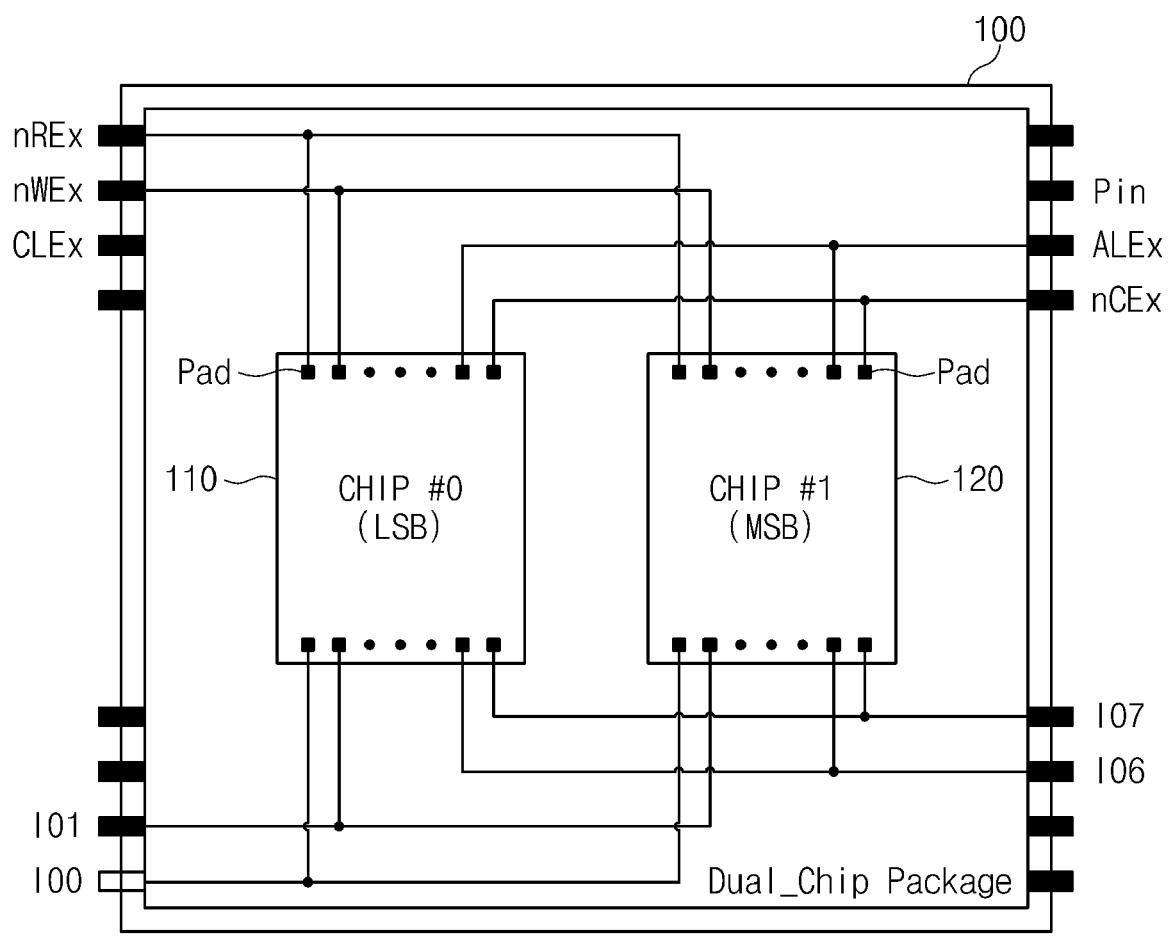
FIG. 1 is a block diagram showing a configuration of a dual chip package module accommodating two memory chips on a single package board.

FIG. 1 is a block diagram showing a configuration of a dual chip package module accommodating two memory chips on a single package board.

As shown in FIG. 1, in the dual chip package module where two memory chips 110 and 120 are mounted on a single package board 100, the two memory chips are differentiated into the upper memory chip 120 and the lower memory chip 110 by means of option pads. For instance, the option pad of the lower memory chip 110 is connected to the ground voltage terminal, while the option pad of the upper memory chip 120 is connected to the power voltage terminal. When an address input from external is set to designate the lower memory chip 110 (e.g., the most significant bit of an input address is identical to a value of the option pad for the lower memory chip 110), it is able to access the lower memory chip 110 by means of the input address. And, when an address input from external is set to designate the upper memory chip 120 (e.g., the most significant bit of an input address is identical to a value of the option pad for the upper memory chip 120), it is able to access the upper memory chip 120 by means of the input address.

With this comparative example, in mind, embodiments of the invention will now be described with reference to the accompanying drawings. The present invention may, however, be embodied in different forms and should not be construed as being limited to only the illustrated embodiments. Rather, the embodiments are presented as teaching examples. Throughout the drawings and accompanying written description, like reference numbers and symbols are used to refer to like or similar elements.

In should further be noted that laser-blown fuses have historically been employed in various logical processors, such as controlling memory redundancy, die identification, etc. More recently, laser-blown fuses have been replaced by electrically programmable fuses. The electrically programmable fuses (hereinafter, referred to as 'e-fuses') may be used to store information (i.e., e-fuse data) about memory chip operations, (e.g., power trimming, optional function, repair, bad block identification, etc.) within a specific field of a constituent memory cell array. E-fuse data may be subsequently retrieved, as it is stored in a series of latches, for example, by means of an e-fuse reading process, typically conducted during a power-up operation.

Figure 2:
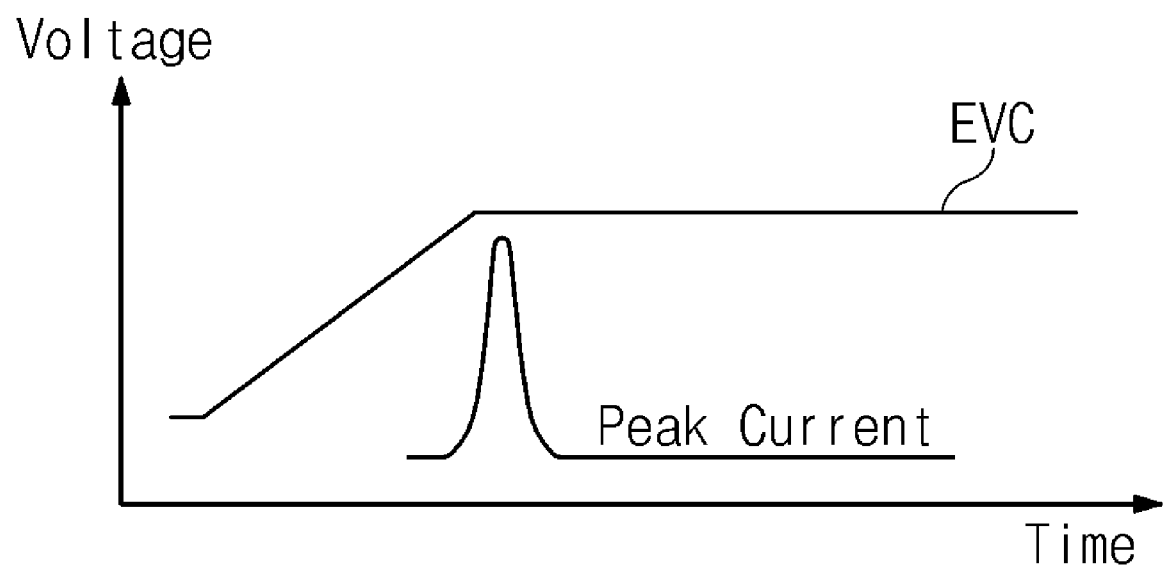
FIG. 2 is graphic diagram showing variation of peak current consumed in a multi-chip package at the time of power-up.

Upon power-up of a multi-chip package including a plurality of memory chips, the plurality of memory chips have e-fuse data read during a single operational phase and period. Therefore, as shown in FIG. 2, an amount of current consumed by the multi-chip package rapidly increases during the power-up operation. For instance, assuming that a multi-chip package includes four memory chips, the multi-chip package consumes during the power-up operation up to four times the current dissipated by a single memory chip. Thus, the multi-chip package may consume up to four times the amount of peak current relative to a single chip. This excessive peak current associated with a power-up operation may result in the malfunction of certain components within one or more of the plurality of memory chips.

Figure 3:
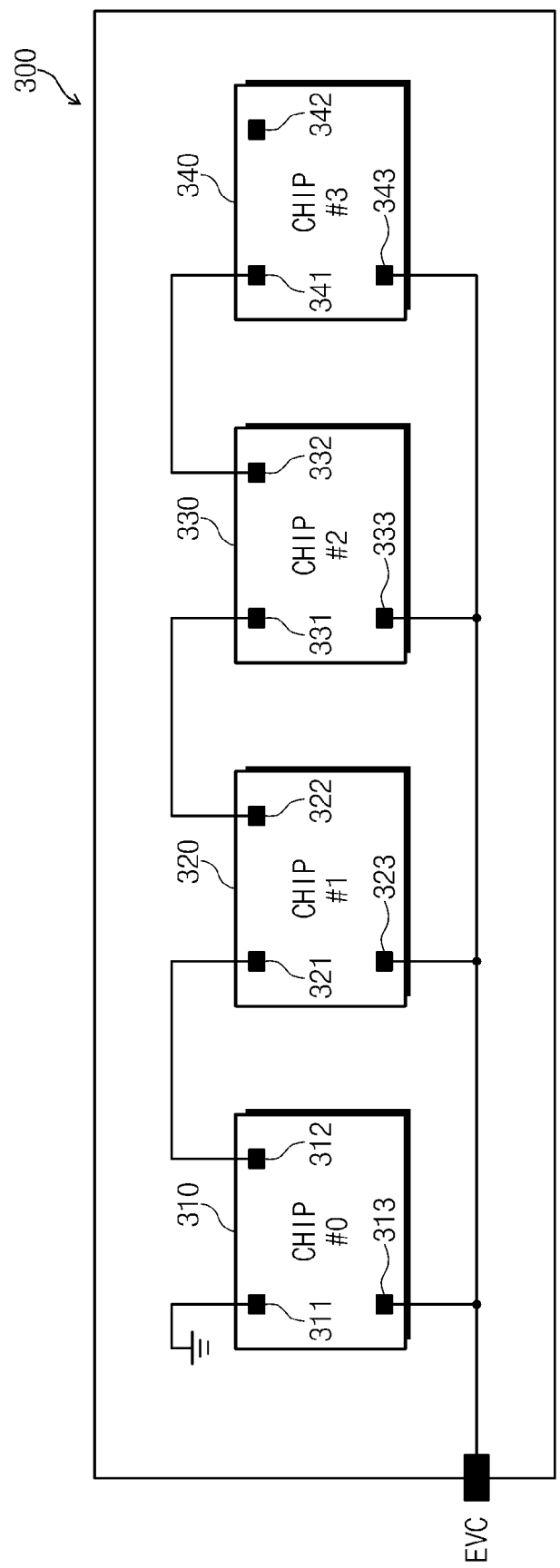
FIG. 3 is a block diagram showing a multi-chip package according to an embodiment of the invention configured to reduce peak current consumed in reading e-fuse data at the time of power-up.

FIG. 3 is a block diagram showing a multi-chip package according to an embodiment of the invention that is configured to reduce peak current consumption related to the reading of stored e-fuse data during a power-up operation.

Referring to FIG. 3, the multi-chip package 300 comprises four (4) memory chips 310~340, but the number of memory chips is merely an arbitrary choice for purposes of explanation. Each one of the plurality of memory chips 310~340 comprises two internal pads that are used to reduce the power-up peak current consumption, and an external pad through which an external power voltage is supplied. Here again, the choice of two internal pads is merely exemplary of other design choices consistent with the teachings of the present invention.

Thus, first memory chip 310 includes internal pads 311, 312, and external pad 313. Second memory chip 320 includes internal pads 321, 322, and external pad 323. Third memory chip 330 includes internal pads 331, 322, and external pad 323, and fourth memory chip 340 includes internal pads 341, 342, and external pad 343.

Each memory chip in the plurality of memory chips 310~340 is connected in series using the internal pads. In the illustrated embodiment, first and second memory chips 310 and 320 are connected to each other through internal pads 312 and 321. Second memory chip 320 is connected to third memory chips 330 through internal pads 322 and 331, and third memory chip 330 is connected to fourth memory chip 340 through internal pads 332 and 341. In the illustrated example, internal pad 311 of first memory chip 310 is connected to ground. Alternately, internal pad 311 of first memory chip 310 may be connected to a power voltage.

The plurality of serial connected memory chips 310~340 have e-fuse data read during a power-up operation in sequence, rather than being read simultaneously, as is conventional. By sequentially reading the e-fuse data stored in first memory chip 310, then second memory chip 320, then third memory chip 330, and so on, the power-up peak current remains significantly below what is conventionally expected, thereby preventing associated malfunctions.

Figure 4:
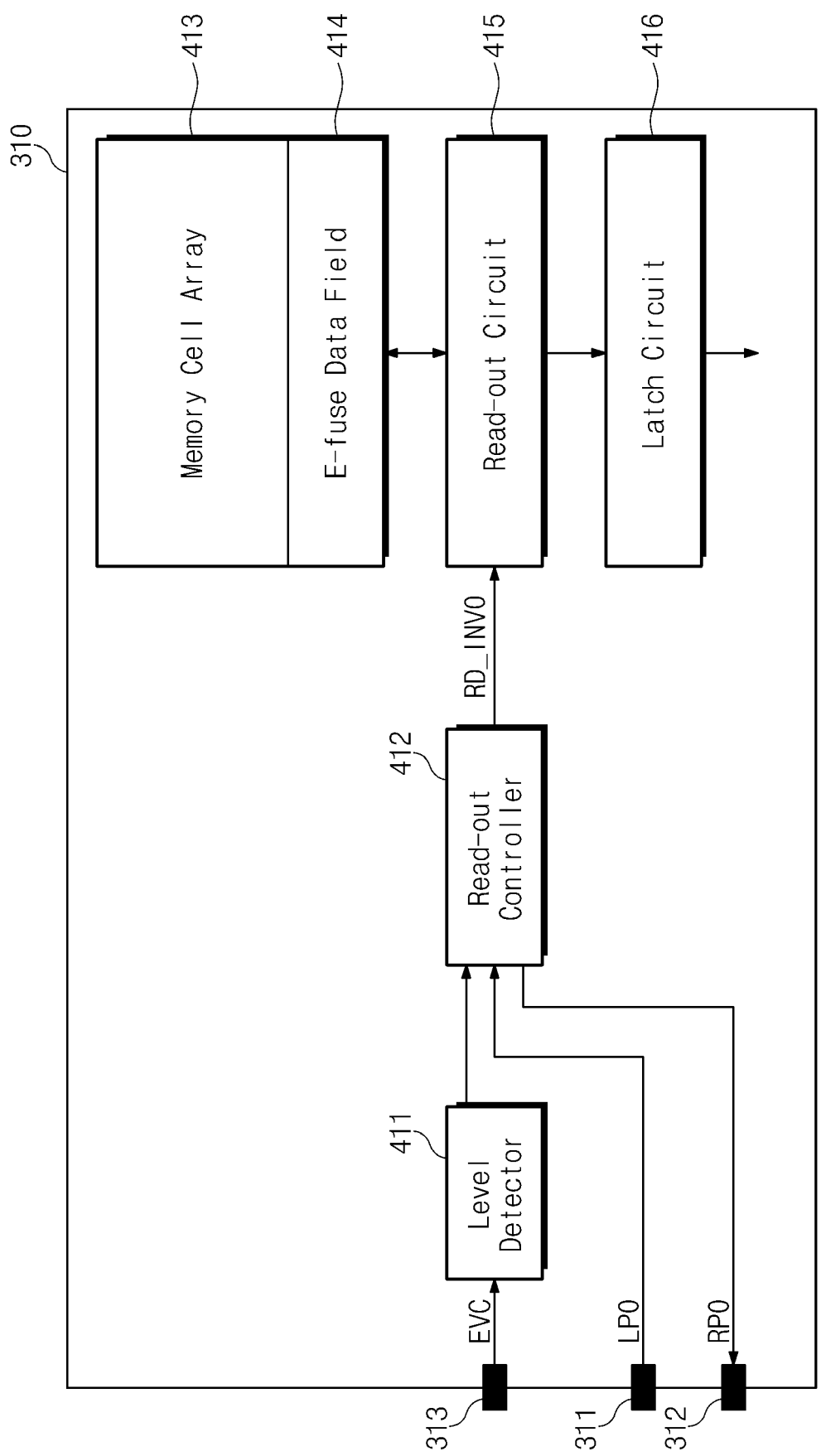
FIG. 4 is a block diagram illustrating a structure of the memory chip shown in FIG. 3.

FIG. 4 is a block diagram illustrating an exemplary internal structure for first memory chip 310 shown in FIG. 3. Other memory chips in the plurality of memory chips 310~340 may be similarly configured.

Referring to FIG. 4, first memory chip 310 comprises a level detector 411, a read-out controller 412, a memory cell array 413, a read-out circuit 415, and a latch circuit 416. In the illustrated embodiment, read-out controller 412 and read-out circuit 414 collectively form a read-out control circuit. Memory cell array 413 includes e-fuse data field 414 storing e-fuse data. The e-fuse data stored in e-fuse data field 414 may be relevant or related to any number of memory device operations, operating parameter definitions, and functionality (e.g., power trimming, optional feature definition, memory cell repair, bad memory cell block definition, etc.).

Level detector 411 outputs a detection signal to read-out controller 412 when the external power voltage EVC increases to a predetermined level. Read-out controller 412 outputs a read-invoking signal RD_INV0 and a signal LP2 in response to a signal LP0 received through first internal pad 311 when the detection signal from level detector 411 is activated.

Read-out circuit 415 operates to read e-fuse data from e-fuse data field 414 in response to the read operation start signal RD_INV0 received from read-out controller 412. The e-fuse data read from e-fuse data field 414 by means of read-out circuit 415 may be stored in latch circuit 416.

An exemplary operation of first memory chip 310, such as the one illustrated in FIG. 4, will be described in conjunction with the timing diagram shown in FIG. 5.

Figure 5:
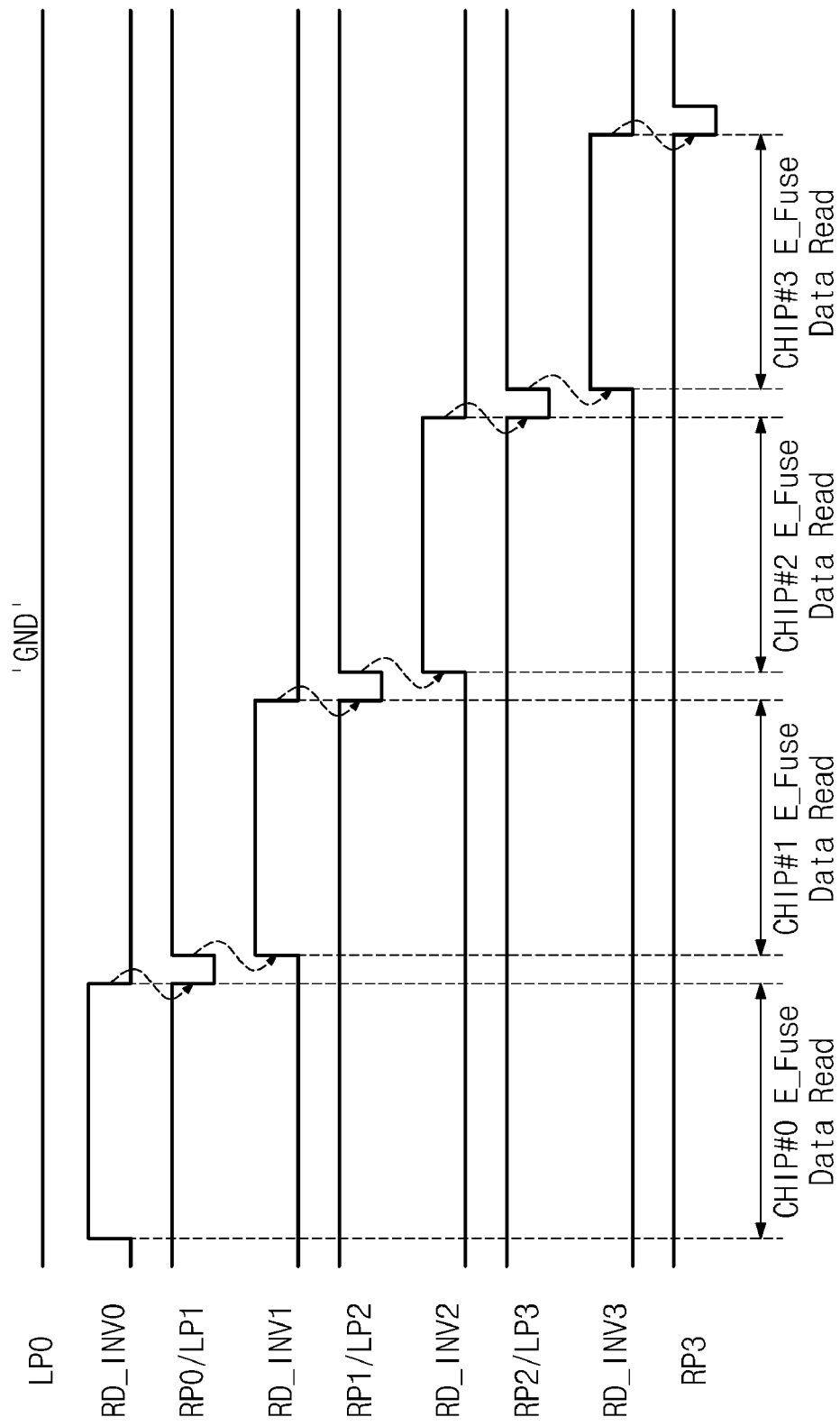
FIG. 5 is a timing diagram of signals operating in the memory chip show in FIG. 3.

Referring to FIGS. 4 and 5, multi-chip package 300 undergoes a powered-up operation during which the external power voltage EVC rises to a predetermined level. Once the external power voltage EVC reaches this predetermined level, read-out controller 412 generates read signal RD_INV0 in response to control signal LP1 received through internal pad 311. Read signal RD_INV0 remains activated (e.g., remains high) during a predetermined read period. Read-out circuit 415 operates to read e-fuse data from e-fuse data field 414 in response to an activated read signal RD_INV0. After the read period is completed, read-out controller 412 generates a pulse signal RP0 at internal pad 312 once read signal RD_INV0 becomes deactivated (e.g., goes low).

The pulse signal RP0 provided from first memory chip 310 is communicated to second memory chip 320 as a control signal via internal pad 321, as shown in FIG. 3. In this manner, the plurality of memory chips 310~340 within multi-chip package 300 are able to sequentially read E-fuse data.

Figure 6:
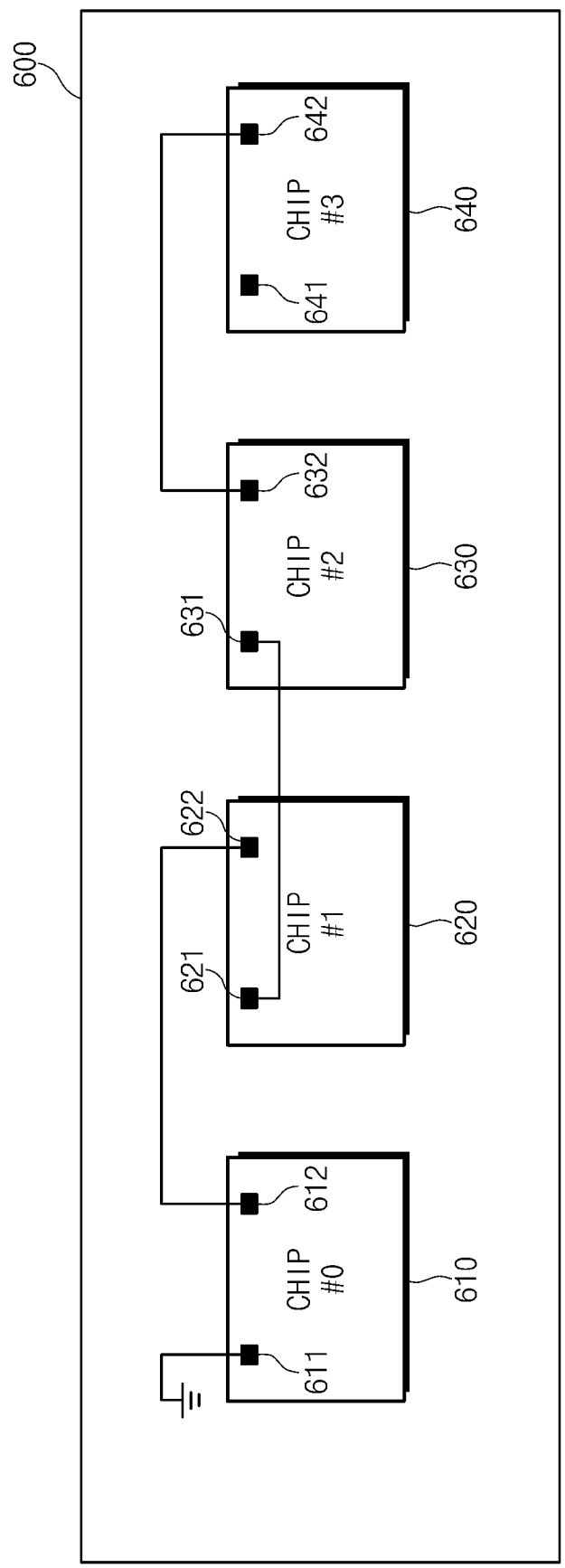
FIG. 6 is a block diagram showing a configuration of a multi-chip package according to another embodiment of the invention.

FIG. 6 is a block diagram showing a configuration of a multi-chip package 600 according to another embodiment of the invention.

Referring to FIG. 6, each memory chip in the plurality of memory chips 610~640 within multi-chip package 600 comprises first and second internal pads. While the plurality of memory chips 610~640 is series connected, internal pad connections are not alternated first to second and second to first between adjacent memory chips. Rather, adjacent first internal pads (621 and 631) and adjacent second internal pads (612 and 622, 632 and 642) are connected. In this context, the first (and second) internal pad for each memory chip are deemed to be similarly laid out with respect to every other first (and second) internal pad on all other memory chips. That is, each memory chip in the plurality of memory chips is said to have "a similar connection pattern of internal pads."

Thus, the plurality of memory chips 610~640 arranged in the embodiment of FIG. 6 may be seen as a stacked arrangement within the multi-chip package 600. That is, in order to prevent the interconnections between adjacent memory chips in the plurality of memory chips 610~640 from being tangled, the illustrated embodiment connect first-to-first and second-to-second internal pads in a crossing pattern as shown in FIG. 6. Internal circuit structures for the individual memory chips in the plurality of memory chips 610~640 shown in FIG. 6 may be the same as those shown in FIG. 4.

Figure 7:
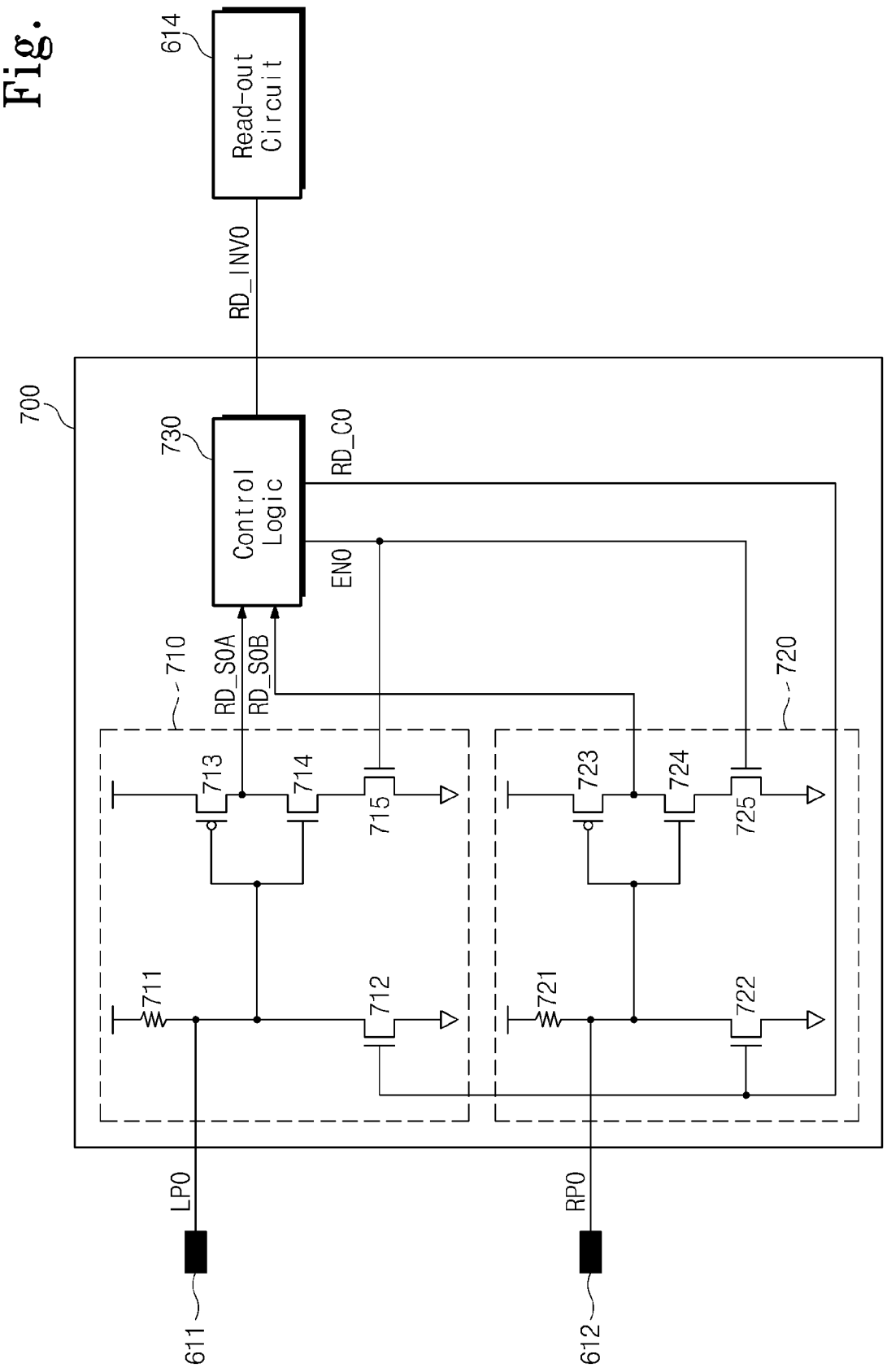
FIG. 7 is a circuit diagram showing a read-out control circuit included in the memory chip of the multi-chip package shown in FIG. 6.

FIG. 7 is a circuit diagram further illustrating a read-out control circuit incorporated within a memory chip in the multi-chip package shown in FIG. 6.

Referring to FIG. 7, read-out controller 700 comprises a first interface 710, a second interface 720, and a control logic circuit 730. First interface 710 is connected to first internal pad 611. First interface 710 outputs a first read signal RD_S0A in response to a first control signal LP0 received at first internal pad 611, and/or the combination of a read termination signal RD_C0 and an enabling signal EN0 provided from control logic circuit 730.

In the illustrated embodiment, first interface 710 comprises a pull-up resistor 711, NMOS transistors 712, 714, and 715, and a PMOS transistor 713. One end of pull-up resistor 711 is connected to first internal pad 611. NMOS transistor 712 is connected between pull-up resistor 711 and ground and is controlled by the read termination signal RD_C0. Transistors 713~715 are serially connected between a power voltage and ground. The gates of PMOS and NMOS transistors 713 and 714 are connected to first internal pad 611. The first read signal RD_S0A is output from a node between PMOS and NMOS transistors 713 and 714. The gate of NMOS transistor 715 is coupled to the enabling signal EN0.

Second interface 720 is connected to second internal pad 612. Second interface 720 outputs a second read signal RD_SOB in response to a second control signal RP0 received from second internal pad 612, and/or the combination of read termination signal RD_C0 and an enabling signal EN0 provided from control logic circuit 730. Second interface 720 has essentially the same circuit structure as first interface 720.

Control logic circuit 730 generates the read signal RD_INV0, the enabling signal EN0, and the read termination signal RC_C0 in response to the first read signal RD_S0A and the second read signal RD_SOB. Control logic circuit 730 outputs the enabling signals EN0 and the read termination signal RD_C0 when one of the first and second read signals RD_S0A and RD_SOB is activated (e.g., goes high).

Figure 8:
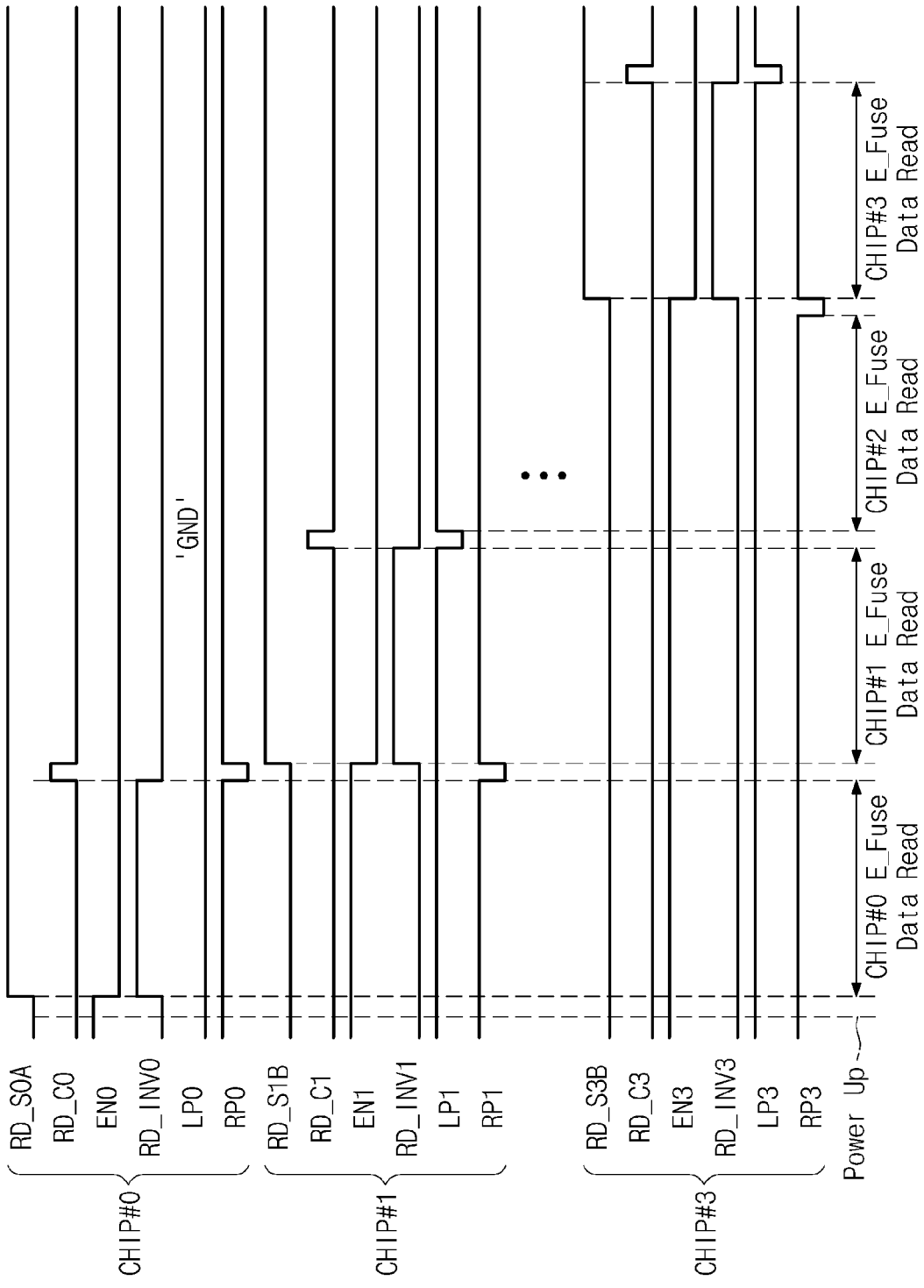
FIG. 8 is a timing diagram of signals operating in the read-out control circuit.

FIG. 8 is a related timing diagram for of signals associated with the operation of read-out controller 700 shown in FIG. 7.

Referring to FIGS. 6 through 8, upon power-up, the first control signal LP0 applied to first internal pad 611 of first memory chip 610 is activated (e.g., is held low) while the remaining first internal pads 621~641 and all second internal pads 612~642 are not activated (e.g., held high).

As the first control signal LP0 is applied to first internal pad 611 of first memory chip 610, PMOS transistor 713 is turned ON which activates the first read signal RD_S0A (e.g., goes high). Control logic circuit 730 then activates (e.g., is held high) the read signal RD_INV0, which remains activated during the predetermined read period in response to the activated first read signal RD_S0A. Read-out circuit 615 then operates to read e-fuse data from a corresponding e-fuse data field in response to the read signal RD_INV0.

Control logic circuit 730 causes the enabling signal EN0 to be deactivated (e.g., to go low) at the same time the first read signal RD_S0A is activated. NMOS transistors 715 and 722 are turned OFF in response to the enabling signal EN0.

After the predetermined read period, control logic circuit 730 allows the read signal RD_INV0 to deactivate (e.g., go low) and correspondingly outputs an activated (e.g., a high) pulse signal as read termination signal RD_C0. While the read termination signal RD_C0 is activated, NMOS transistors 712 and 722 are turned ON. Then, the pulse signal RP1 is output from second internal pad 612 as a first control signal to the next memory chip in the series connected sequence of memory chips in order to facilitate the reading of e-fuse data.

However, pulse signal RP1 is applied to second internal pad 622 of second memory chip 620 in order to facilitate the reading of e-fuse data from second memory chip 620. This approach continues down the sequence of series connected memory chips.

As shown in FIG. 6, since first and second interfaces 710 and 720 are structurally the same, one of the internal pads 611 and 621 is used for receiving a respective first control signal (e.g., RP0, RP1, etc.) while the other internal pad is used for outputting a pulsed second signal (e.g., LP1, LP2, etc.). Therefore, although the plurality of memory chips 610~640 may be designed with a common structure and the same connection pattern, it is possible to alternate the connection of related internal pads between respective memory chips 610~640 in the multi-chip package 600 to facilitate a simple stacked connected structure.

Like the embodiment described in relation to FIGS. 3 and 4, the embodiment described in relation to FIGS. 6 and 7 is able to reduce peak current consumption during a power-up operation by sequentially reading e-fuse data from the plurality of memory chips 610~640 within multi-chip package 600.

Figure 9:
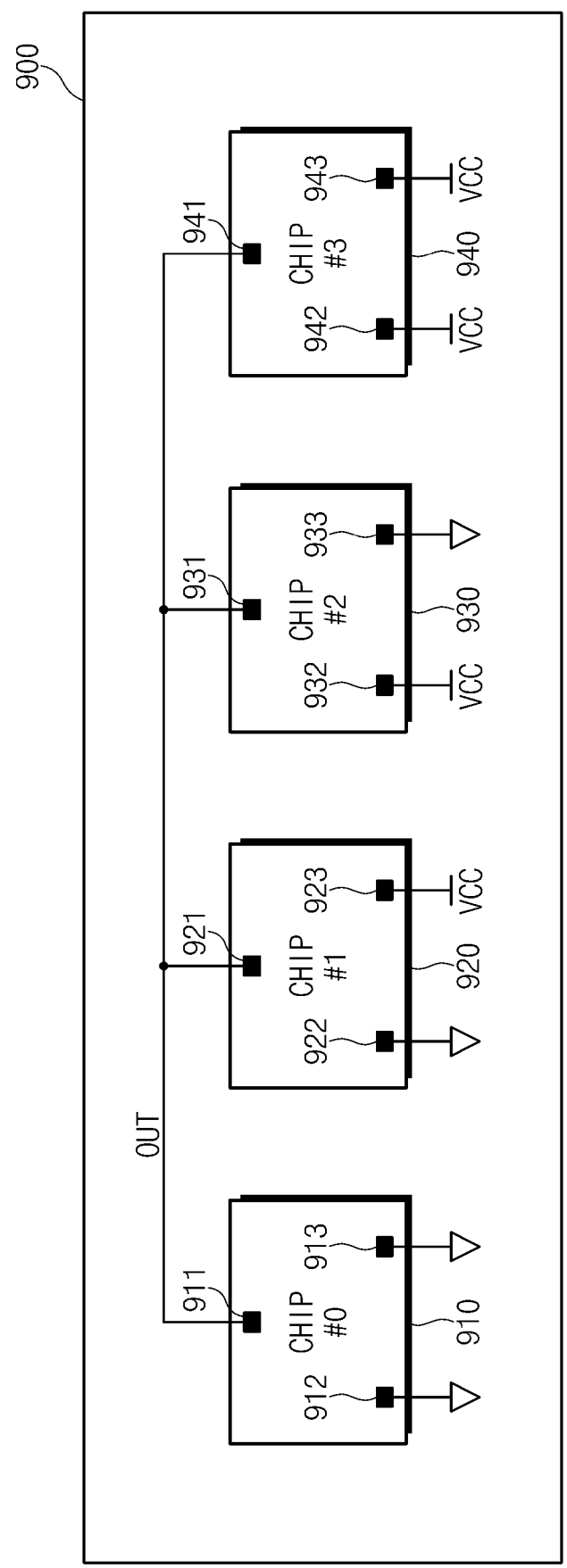
FIG. 9 is a block diagram showing a configuration of a multi-chip package according to another embodiment of the invention.

FIG. 9 is a block diagram showing a configuration of a multi-chip package according to another embodiment of the invention.

Referring to FIG. 9, a multi-chip package 900 comprises a plurality of memory chips 910~940. Each one of the plurality of memory chips 910~940 comprises includes three (3) internal pads. For example, a first memory chip 910 comprises internal pads 911, 912, and 913, where second and third internal pads 912 and 913 are respectively connected to either ground or a power voltage (e.g. VCC). The varying connection of second and third internal pads differentiates respective memory chips with the plurality of memory chips 910~940. However, first internal pad 911 is commonly connected with all other first internal pads (e.g., 921, 931, and 941) within the plurality of memory chips 910~940.

Figure 10:
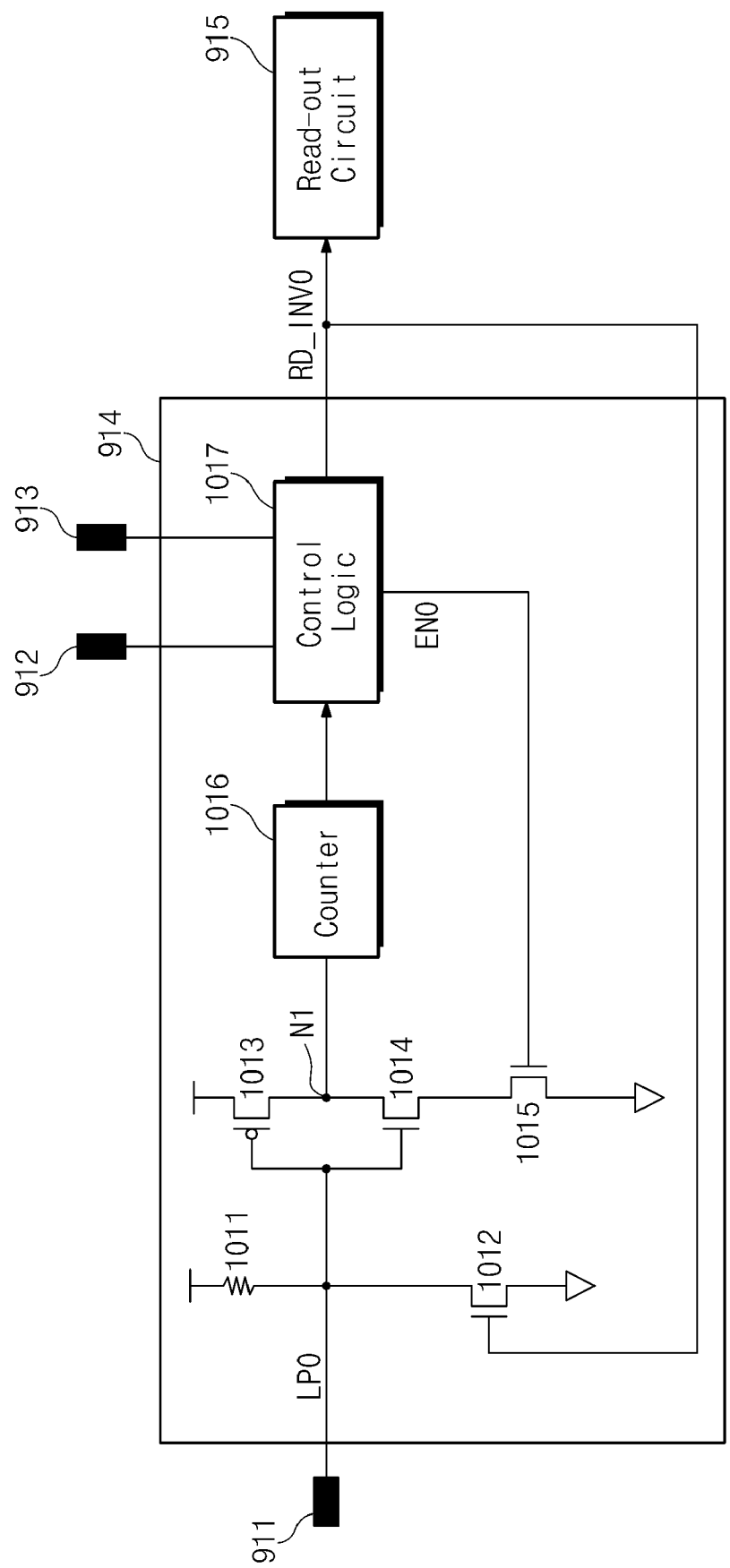
FIG. 10 is a circuit diagram showing a read-out control circuit included in the memory chip of the multi-chip package shown in FIG. 9.

FIG. 10 is a circuit diagram showing a read-out controller 914 according to an embodiment of the invention and included within respective memory chips in multi-chip package 900, as shown in FIG. 9.

Referring to FIG. 10, read-out controller 914 comprises a pull-up resistor 1011, NMOS transistors 1012, 1014, and 1015, a PMOS transistor 1013, a counter 1016, and a control logic circuit 1017. One end of pull-up resistor 1011 is connected to first internal pad 911. NMOS transistor 1012 is connected between pull-up resistor 1011 and ground and is controlled by the read termination signal RD_C0 received from read-out circuit 915.

Transistors 1013~1015 are series connected between a power voltage and ground. The gates of PMOS and NMOS transistors 1013 and 1014 are connected to the first internal pad 911, and the gate of NMOS transistor 1015 is connected to the enabling signal EN0 provided by control logic circuit 1017. Counter 1016 operates to count a number of falling edges for a timing signal apparent at node N1 between transistors 1013 and 1014, and then provides a counted value to control logic circuit 1017. Control logic circuit 1017 outputs the read signal RD_INV0, which is maintained as activated during the predetermined read period, when a counted value output from counter 1016 is identical to a value indicated by the first and second control signals apparent at second and third internal pads 912 and 913. Control logic circuit 1017 also activates the enabling signal EN0 during this period.

Figure 11:
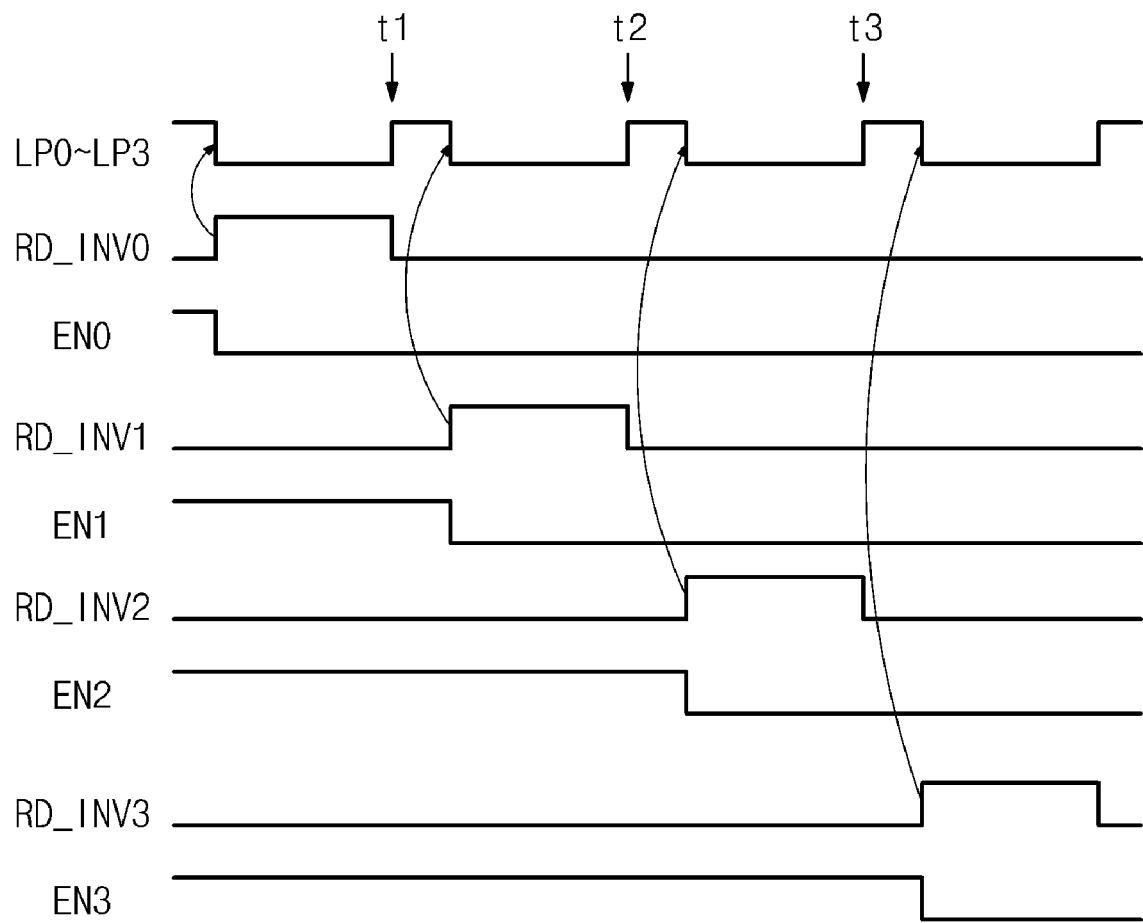
FIG. 11 is a timing diagram showing signals output from the memory chips shown in FIG. 9.

The operation of read-out controller 914 shown in FIG. 10 will be further described in relation to the timing relationships shown in FIG. 11.

Referring to FIGS. 9 through 11, an activated first control signal LP0 is received through first internal pad 911 of first memory chip 910 through pull-up resistor 101 upon power-up. If an initial value for counter 1016 is '0', control logic circuit 1017 outputs an activated read signal RD_INV0 which is maintained throughout the predetermined read period, since the value '0' indicated by counter 1016 agrees to the value '00' indicated by first and second control signals, as applied through second and third pads 912 and 913. Control logic circuit 1017 also activates the enabling signal EN0.

So long as the read signal RD_INV0 is activated, read-out circuit 915 conducts a e-fuse date read operation. Responding to that the activated read signal RD_INV0, NMOS transistor 1012 is turned ON to retain the control signal apparent at first internal pad 911 as active (e.g., low). However, upon completion of the e-fuse data read period, the read signal RD_INV0 deactivates (e.g., goes low), and NMOS transistor 1012 is turned OFF to output a deactivated version (e.g., high) of the control signal apparent at first internal pad 911 through pull-up resistor 1011.

During this time, respective counters in memory chips 910~940 are executing a counting operation whenever the applied common control signals LP0~LP3 received through respective first internal pads 911~941 transition from activated to deactivated, (i.e., at points t1~t3 in the timing diagram of FIG. 11).

For instance, the second counter of second memory chip 920 begins its counting operation as the timing signal apparent at node N1 transitions at point t1. Since the counted value provided from counter 1016 in second memory chip 920 is now '1' and the value indicated by the first and control signals applied to second and third internal pads 922 and 923 is also '01', control logic circuit 1017 in second memory chip 920 generates an activated read signal RD_INV0, and so throughput all the memory chips in the plurality of memory chips.

Figure 12:
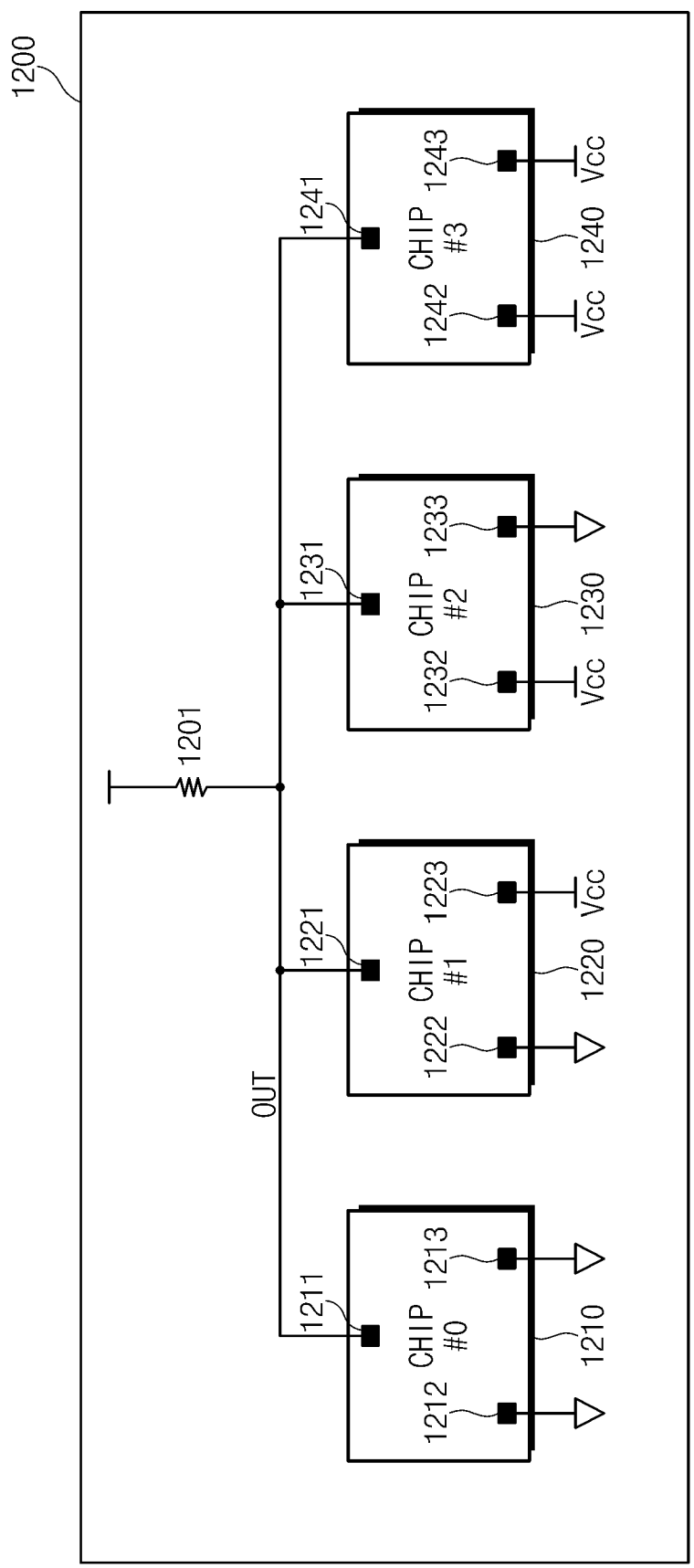
FIG. 12 a block diagram showing a configuration of a multi-chip package according to another embodiment of the invention.

FIG. 12 a block diagram showing a configuration of a multi-chip package according to another embodiment of the invention.

The multi-chip package 1200 shown in FIG. 12 comprises a plurality of memory chips 1210~1240. Each memory chips in the plurality of memory chips 1210~1240 is connected similar to the former embodiment of FIG. 9, except a ready/busy (R/B) signal is commonly applied to each first internal pad 1211~1241. In the illustrated embodiment, this commonly applied ready/busy signal is connected through a pull-up resistor 1201. The multi-chip package 1200 of FIG. 12 is similar to the multi-chip package 900 of FIG. 9, but different therefrom in the feature that pull-up resistor 1201 is disposed external to the plurality of memory chips 1210~1240. In other words, the memory chips 1210~1240 do not include a respective pull-up resistor.

Figure 13:
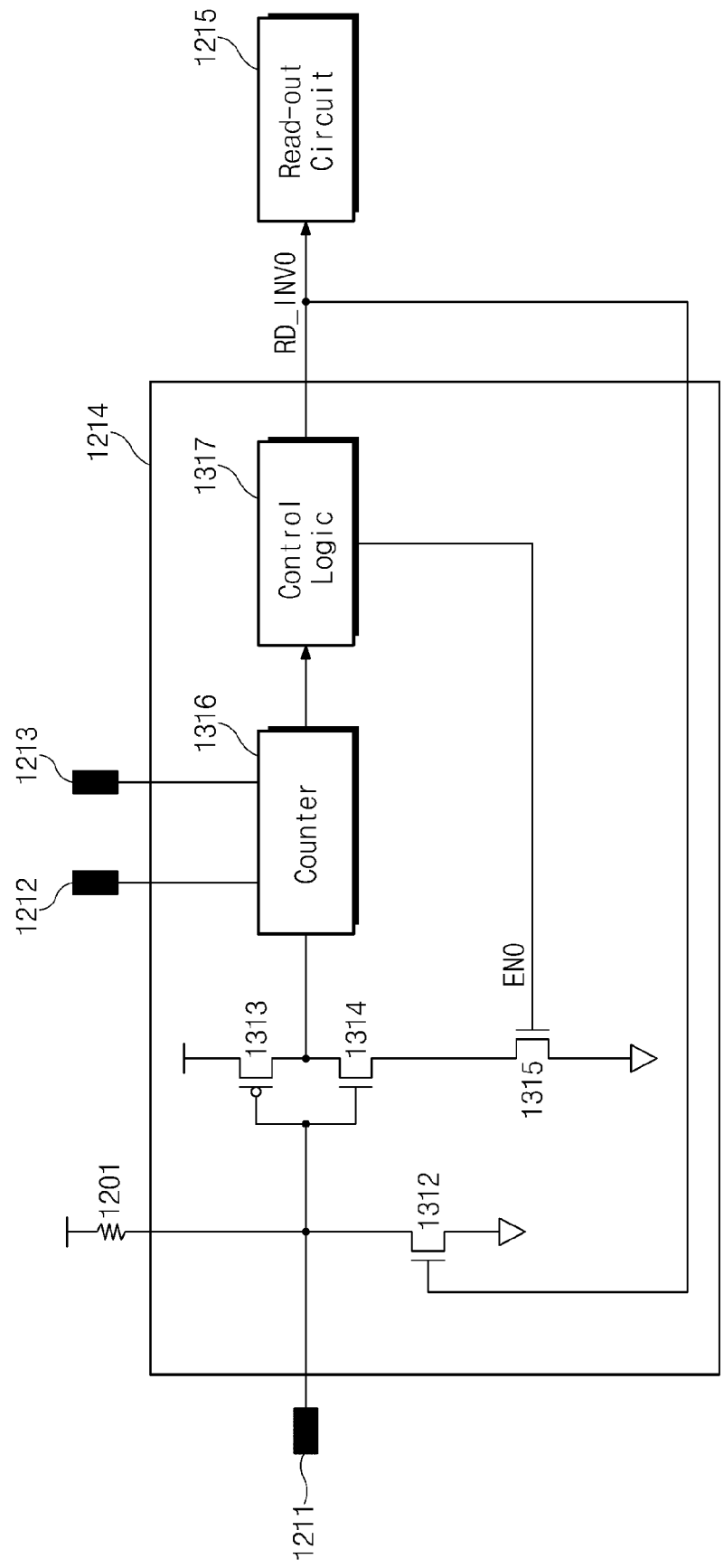
FIG. 13 is a circuit diagram showing a read-out control circuit included in the memory chip of the multi-chip package shown in FIG. 12.

FIG. 13 is a circuit diagram further illustrating a read-out controller 1214 for first memory chip 1210 of multi-chip package 1200 shown in FIG. 12. Read-out controller 1214 is similar to read-out controller 914 of FIG. 10, but without the pull-up resistor. However, like all previous embodiments, the embodiment illustrated in FIG. 12 is advantageous to reducing excessive peak current during an e-fuse data read-out operation for memory chips 1210~1240.

Figure 14:
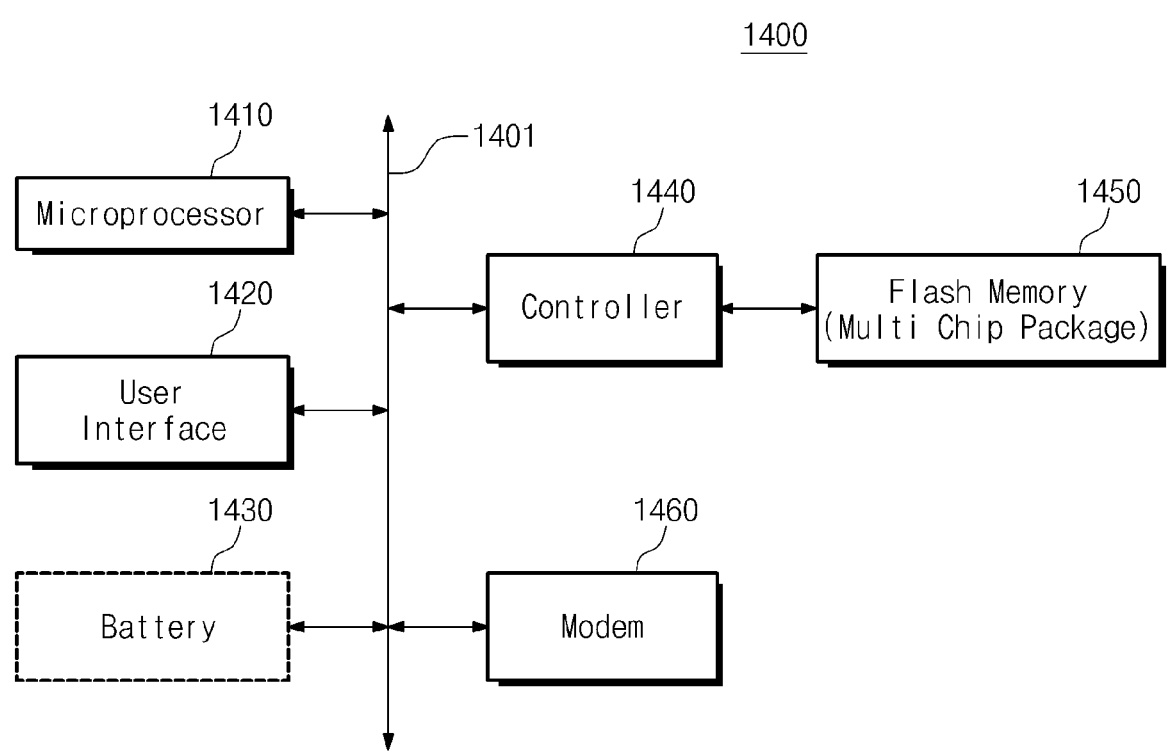
FIG. 14 is a block diagram of a computational logic system employing one or more multi-chip packages according to embodiments of the invention.

A computational system 1400 employing a multi-chip package consistent with an embodiment of the invention is schematically illustrated in FIG. 14. Computational system 1400 comprises a microprocessor 1410, a user interface 1420, a modem 1430 such as a baseband chipset, a memory controller 1440, and the flash memory device 1450, all of which are connected to a bus 1401. Flash memory device 1450 may be configured in the form of a multi-chip package like the one shown in FIG. 3, FIG. 6, FIG. 9, and/or FIG. 12.

Flash memory device 1450 may be used to store N-bit data, where N is a positive integer, being processed by microprocessor 1410 and/or memory controller 1440. If the computational system shown in FIG. 14 is a mobile apparatus, it may further comprise a battery 1430 for supplying power. Although not shown in FIG. 14, computational system 1400 may further comprise an application chipset, a camera image processor (e.g., CMOS image sensor; CIS), a mobile DRAM, etc. Memory controller 1440 and flash memory device 1450 may constitute a solid state drive or disk using a nonvolatile type as a memory for storing data. In some embodiments, memory controller 1440 and flash memory device 1450 may be mounted on a single package board.

The memory chips according to the present invention can be mounted on computational system 1400 using various types of packages. For instance, the memory chips of the present invention may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

According to embodiments of the invention, a multi-chip package may be advantageous implemented with reduced a peak current during an e-fuse reading operation directed to a plurality of memory chips by sequentially reading each memory chip instead of simultaneously reading all memory chips at once.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents, and shall not be restricted or limited to only the foregoing detailed description.

What is claimed is:

1. A multi-chip package, comprising:
   a plurality of memory chips, each comprising:
      a memory cell array storing e-fuse data,
      a read-out control circuit performing a read operation directed to the e-fuse data in response to a read signal,
      a first internal pad receiving a first control signal;
      a read-out controller responsive to the first control signal to generate the read signal defining a read period for the read operation, and to generate a second control signal following the read period, and
      a second internal pad receiving the second control signal from the read-out controller;
   wherein the plurality of memory chips is connected series and each respective read-out control circuit and read-out controller in each one of the plurality of memory chips cooperate to implement a sequential read of e-fuse data across the plurality of memory chips.

2. The multi-chip package of claim 1, wherein the plurality of memory chips comprises first and second memory chips,
   the first and second internal pads are included in a similar connection pattern for each one of the plurality memory chips; and
   the second internal pad of the first memory chip is connected to the first internal pad of the second memory.

3. The multi-chip package of claim 1, wherein the plurality of memory chips comprises first and second memory chips,
   the first and second internal pads are included in a similar connection pattern for each one of the plurality memory chips; and
   the second internal pad of the first memory chip is connected to the second internal pad of the second memory.

4. The multi-chip package of claim 3, wherein the plurality of memory chips further comprises a third memory chips, and the first internal pad of the second memory chip is connected to the first internal pad of the third memory chip.

5. The multi-chip package of claim 4, wherein the first internal pad of the first memory chip is connected to ground.

6. The multi-chip package of claim 1, wherein each one of the plurality of memory chips further comprises an external pad connected to an external power voltage.

7. The multi-chip package of claim 4, wherein the read-out controller comprises:
   a control logic circuit generating the read signal, a read termination signal, and an enabling signal;
   a first interface receiving the first control signal from the first internal pad, and receiving the read termination signal and the an enabling signal from the control logic circuit, and generating a first read signal in response thereto; and
   a second interface receiving a second control signal from the second internal pad, and receiving the read termination signal and the an enabling signal from the control logic circuit, and generating a second read signal in response thereto,
   wherein the control logic circuit generates the read signal in response to the first and second read signals respectively provided by the first and second interfaces.

8. The multi-chip package of claim 7, wherein the first interface comprises:
   a pull-up resistor connected to the first internal pad;
   a first transistor connected between the pull-up resistor and ground, and controlled by the read termination signal; and
   second, third and fourth transistors connected between a power voltage and ground,
   wherein the gates of the second and third transistors are connected to the pull-up resistor and the gate of the fourth transistor is connected to the enabling signal, and the first read signal is generated at a node between the second and third transistors.

9. The multi-chip package as set forth in claim 8, wherein the second interface comprises:
   a pull-up resistor connected to the second internal pad;
   a fifth transistor connected between the pull-up resistor and ground and controlled by the read termination signal; and
   sixth, seventh and eighth transistors connected between the power voltage and ground,
   wherein the gates of the sixth and seventh transistors are connected to the pull-up resistor, and the gate of the eighth transistor is connected to the enabling signal, and the second read signal is generated at a node between the sixth and seventh transistors.

10. A multi-chip package, comprising:
    a plurality of memory chips, each comprising:
       a memory cell array storing e-fuse data,
       a read-out control circuit performing a read operation directed to the e-fuse data in response to a read signal,
       a first internal pad connected to a common control signal;
       a read-out controller responsive to the first control signal to generate the read signal defining a read period for the read operation, and to generate a second control signal following the read period, and
       second and third internal pads respectively connected to either ground or a power voltage to differentiate each memory chip in the plurality of memory chips;
    wherein the plurality of memory chips is connected series and each respective read-out control circuit and read-out controller in each one of the plurality of memory chips cooperate to implement a sequential read of e-fuse data across the plurality of memory chips.

11. The multi-chip package of claim 10, wherein the read-out controller comprises:
    an interface circuit receiving the common control signal via the first internal pad and receiving the read signal, and generating a counted value in response thereto; and
    a control logic circuit respectively receiving either a ground voltage or a power voltage via first and second internal pads and the counted value from the interface circuit, and generating the read signal and an enabling signal in response thereto.

12. The multi-chip package of claim 11, wherein the interface circuit comprises:
   a pull-up resistor connected to the first internal pad;
   a first transistor connected between the pull-up resistor and ground and controlled by the read signal;
   second, third and fourth transistors series connected between the power voltage and ground, the gates of the second and third transistors being connected to the pull-up resistor, and the gate of the fourth transistor receiving the enabling signal; and
   a counter generating the counted value in relation to logical transitions in a timing signal apparent at a node between the second and third transistors.

13. The multi-chip package of claim 12, wherein the control logic circuit outputs the read signal when a number of transitions in the timing signal is identical to a value indicated by the power voltage or ground connections apparent at the second and third internal pads.

14. The multi-chip package of claim 10, wherein the common control signal is connected to a pull-up resistor external to any one of the plurality of memory chips.

15. The multi-chip package of claim 10, wherein the read-out controller comprises:
   an interface circuit receiving the common control signal via the first internal pad and receiving the read signal, and generating a counted value in response thereto; and
   a control logic circuit respectively receiving either a ground voltage or a power voltage via first and second internal pads and the counted value from the interface circuit, and generating the read signal and an enabling signal in response thereto.

16. The multi-chip package of claim 15, wherein the interface circuit comprises:
   a first transistor connected to the first internal pad receiving the common control signal from the externally pull-up resistor and ground and controlled by the read signal;
   second, third and fourth transistors series connected between the power voltage and ground, the gates of the second and third transistors being connected to the pull-up resistor, and the gate of the fourth transistor receiving the enabling signal; and
   a counter generating the counted value in relation to logical transitions in a timing signal apparent at a node between the second and third transistors.

17. The multi-chip package of claim 16, wherein the control logic circuit outputs the read signal when a number of transitions in the timing signal is identical to a value indicated by the power voltage or ground connections apparent at the second and third internal pads.

18. A computational logic system, comprising:
   a microprocessor and a memory controller connected via a bus and cooperating to store data in a memory device implemented in the computational logic system, wherein the package comprises:
   a plurality of memory chips, each comprising:
      a memory cell array storing e-fuse data,
      a read-out control circuit performing a read operation directed to the e-fuse data in response to a read signal,
      a first internal pad receiving a first control signal;
      a read-out controller responsive to the first control signal to generate the read signal defining a read period for the read operation, and to generate a second control signal following the read period, and
      a second internal pad receiving the second control signal from the read-out controller;
   wherein the plurality of memory chips is connected series and each respective read-out control circuit and read-out controller in each one of the plurality of memory chips cooperate to implement a sequential read of e-fuse data across the plurality of memory chips.

19. The multi-chip package of claim 18, wherein the memory device is a flash memory device.

* * * * *